(12) United States Patent
Al-kadi et al.

(10) Patent No.: US 11,057,010 B2
(45) Date of Patent: Jul. 6, 2021

(54) POWER AMPLIFIER AND METHOD OF OPERATING A POWER AMPLIFIER

(71) Applicant: NXP B.V., Eindhoven (NL)

(72) Inventors: Ghiath Al-kadi, Graz (AT); Erich Merlin, Gratkorn (AT); Ulrich Neffe, Albersdorf-Prebuch (AT); Ludovic Oddoart, Opio (FR)

(73) Assignee: NXP B.V., Eindhoven (NL)

( * ) Notice: Subject to any disclaimer, the term of this patent is extended or adjusted under 35 U.S.C. 154(b) by 25 days.

(21) Appl. No.: 16/711,562

(22) Filed: Dec. 12, 2019

(65) Prior Publication Data
US 2020/0204123 A1 Jun. 25, 2020

(30) Foreign Application Priority Data
Dec. 21, 2018 (EP) .................................... 18306791

(51) Int. Cl.
| | | |
|---|---|---|
| H03F 3/38 | (2006.01) | |
| H03F 3/217 | (2006.01) | |
| H03F 3/26 | (2006.01) | |
| H03F 1/02 | (2006.01) | |
| H03F 1/26 | (2006.01) | |
| H03F 1/56 | (2006.01) | |
| H04B 5/00 | (2006.01) | |

(52) U.S. Cl.
CPC .......... *H03F 3/265* (2013.01); *H03F 1/0211* (2013.01); *H03F 1/26* (2013.01); *H03F 1/56* (2013.01); *H03F 2200/451* (2013.01); *H04B 5/0075* (2013.01)

(58) Field of Classification Search
CPC .......... H03F 3/38; H03F 3/217; H03F 3/2171
USPC ....................................... 330/10, 207 A, 251
See application file for complete search history.

(56) References Cited

U.S. PATENT DOCUMENTS

| | | | |
|---|---|---|---|
| 4,894,621 A | 1/1990 | Koenig et al. | |
| 7,701,307 B2 | 4/2010 | Beale et al. | |
| 9,019,008 B2 * | 4/2015 | Van Holland | ......... H03F 3/2178 330/10 |
| 9,172,329 B2 | 10/2015 | Ciacci et al. | |
| 2011/0260793 A1 | 10/2011 | Jiang et al. | |
| 2013/0129016 A1 | 5/2013 | Arnold et al. | |

FOREIGN PATENT DOCUMENTS

| | | |
|---|---|---|
| EP | 2693634 A1 | 2/2014 |
| WO | WO-2007/069193 A2 | 6/2007 |

* cited by examiner

*Primary Examiner* — Steven J Mottola

(57) ABSTRACT

Embodiments of a power amplifier and method of operating a power amplifier are disclosed. In one embodiment, a power amplifier includes a pulse wave modulation (PWM) controller, a first power control stage configured to drive a first output between VDD and VSS in response to a control signal from the PWM controller, a second power control stage configured to drive a second output between VDD and VSS in response to a control signal from the PWM controller, and a mid-voltage control circuit configured to hold the voltage of the first output at a mid-voltage that is between VDD and VSS during an interval between when the first output is driven between VDD and VSS and hold the voltage of the second output at the mid-voltage during an interval between when the first output is driven between VDD and VSS.

11 Claims, 9 Drawing Sheets

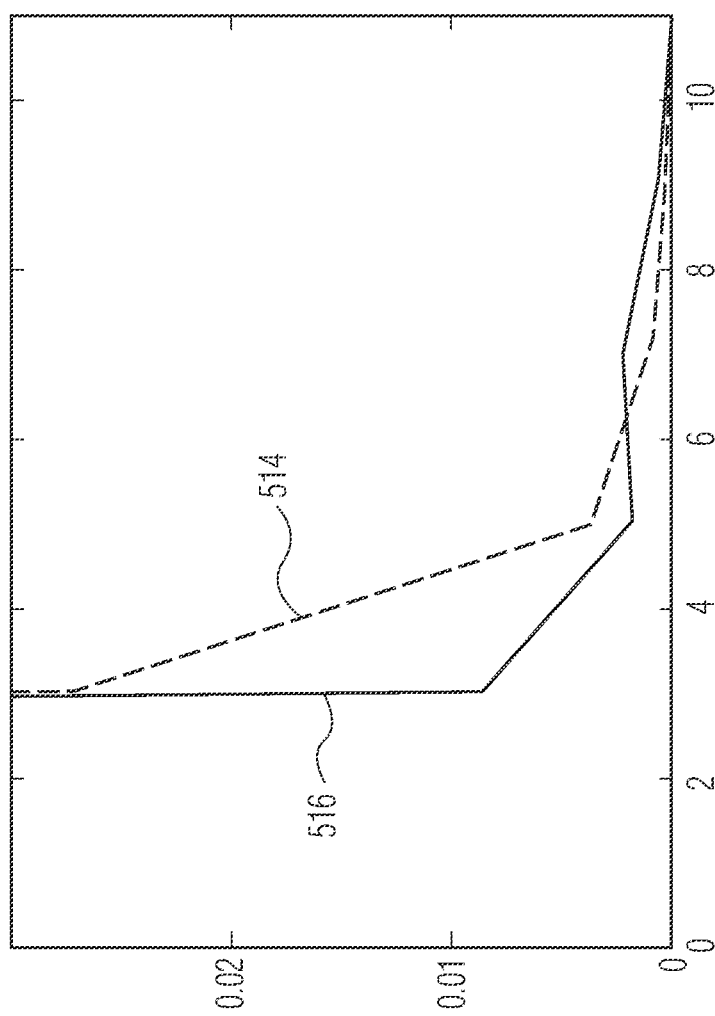

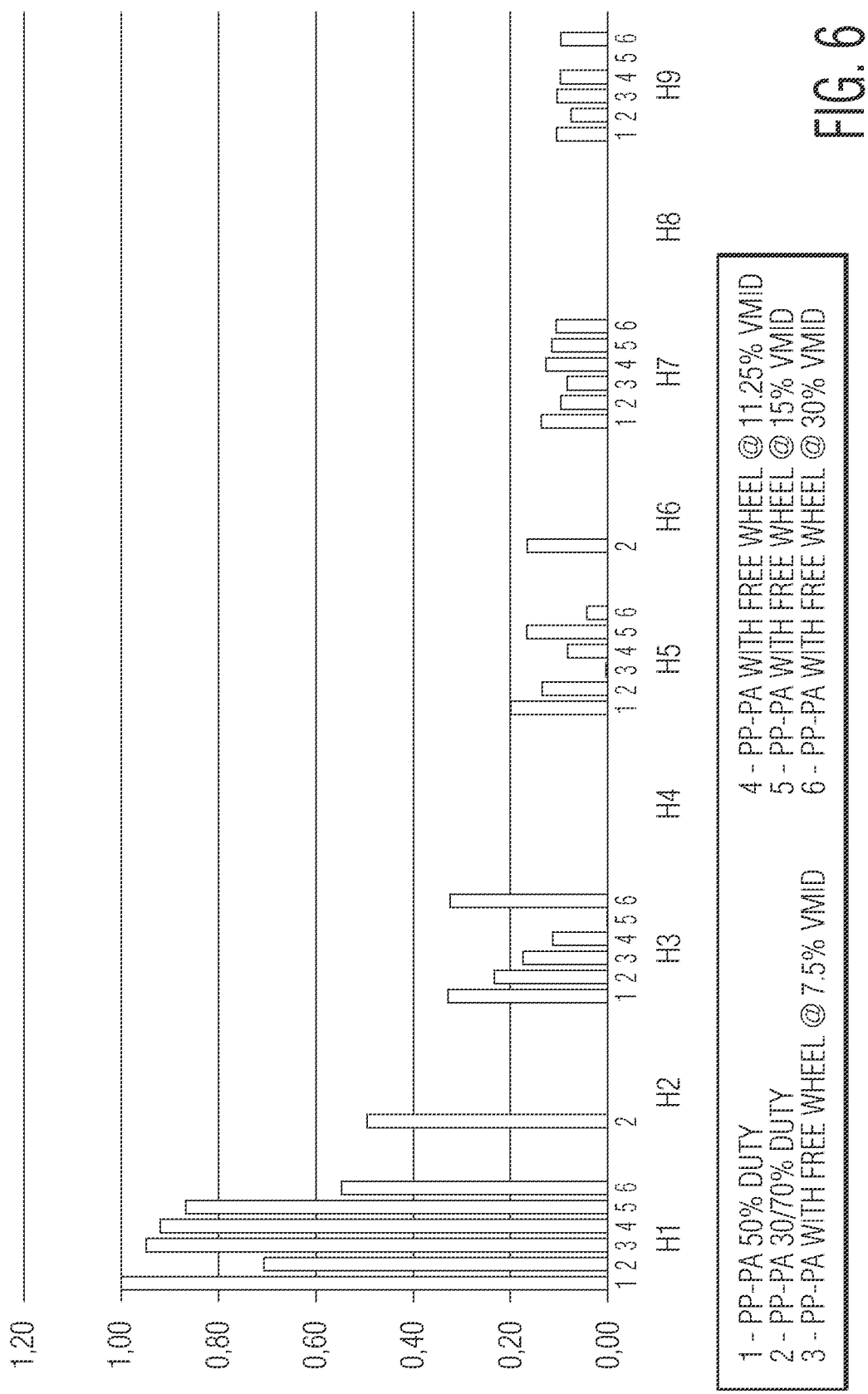

POWER AMPLIFIER AND METHOD OF OPERATING A POWER AMPLIFIER

CROSS-REFERENCE TO RELATED APPLICATIONS

This application claims priority under 35 U.S.C. § 119 to European Patent Application No. 18306791.7, filed on Dec. 21, 2018, the contents of which are incorporated by reference herein.

BACKGROUND

Near Field Communication (NFC) is a form of contactless communication between devices that utilizes inductive coupling to transfer energy between devices at close distances (e.g., within a couple of centimeters). NFC devices often utilize a push pull class D power amplifier to drive maximum energy through a matching network that is connected to an antenna. The output of the power amplifiers is a square wave shape that typically includes unwanted higher harmonics. To suppress the unwanted higher harmonics, high quality electromagnetic compatibility (EMC) filters are typically included between the power amplifier and the matching network. EMC filters can be a source of significant power losses and can significantly reduce the total system efficiency. Additionally, high quality EMC filters can be relatively large and expensive. Alternative types of power amplifiers may not exhibit unwanted higher harmonics but can have even lower efficiency factors than using an EMC filter with a push pull class D power amplifier.

SUMMARY

Embodiments of a power amplifier and method of operating a power amplifier are disclosed. In one embodiment, a power amplifier includes a pulse wave modulation (PWM) controller, a first power control stage configured to drive a first output between VDD and VSS in response to a control signal from the PWM controller, a second power control stage configured to drive a second output between VDD and VSS in response to a control signal from the PWM controller, and a mid-voltage control circuit configured to hold the voltage of the first output at a mid-voltage that is between VDD and VSS during an interval between when the first output is driven between VDD and VSS and hold the voltage of the second output at the mid-voltage during an interval between when the first output is driven between VDD and VSS.

In an embodiment of the power amplifier, the mid-voltage control circuit includes a first switch connected to the first output to hold the voltage of the first output at a mid-voltage that is between VDD and VSS during an interval between when the first output is driven between VDD and VSS and a second switch connected to the second output to hold the voltage of the second output at the mid-voltage during an interval between when the second output is driven between VDD and VSS.

In an embodiment of the power amplifier, the mid-voltage control circuit further includes a voltage holding circuit connected between the first and second switches of the mid-voltage control circuit.

In an embodiment of the power amplifier, the voltage holding circuit includes an operational amplifier with one input connected between two series connected resistors, which are connected between VDD and VSS.

In an embodiment of the power amplifier, the first power control stage includes a high-side switch and a low-side switch in series and wherein the first output is connected between the high-side switch and the low-side switch, the second power control stage includes a high-side switch and a low-side switch in series and wherein the second output is connected between the high-side switch and the low-side switch, and wherein the mid-voltage control circuit includes a first switch connected to the first output to hold the voltage of the first output at a mid-voltage that is between VDD and VSS during an interval between when the first output is driven between VDD and VSS and a second switch connected to the second output to hold the voltage of the second output at the mid-voltage during an interval between when the second output is driven between VDD and VSS.

In an embodiment of the power amplifier, the mid-voltage control circuit further includes a voltage holding circuit connected between the first and second switches of the mid-voltage control circuit.

In an embodiment of the power amplifier, the voltage holding circuit includes an operational amplifier with one input connected between two series connected resistors, which are connected between VDD and VSS.

In an embodiment of the power amplifier, the first power control stage includes a high-side switch and a low-side switch in series and wherein the first output is connected between the high-side switch and the low-side switch, the second power control stage includes a high-side switch and a low-side switch in series and wherein the second output is connected between the high-side switch and the low-side switch, and wherein the mid-voltage control circuit includes a first switch connected to the first output to hold the voltage of the first output at a mid-voltage that is between VDD and VSS during an interval between when the first output is driven between VDD and VSS and a second switch connected to the second output to hold the voltage of the second output at the mid-voltage during an interval between when the second output is driven between VDD and VSS, and wherein the PWM controller is configured to provide a high-side switch control signal, P1, to control the highside switch of the first power control stage and a low-side switch control signal, N1, to control the low-side switch of the first power control stage, provide a high-side switch control signal, P2, to control the high-side switch of the second power control stage and a low-side switch control signal, N2, to control the low-side switch of the first power control stage, and to provide a freewheel control signal, FW, to control the first switch and the second switch of the mid-voltage control circuit.

In an embodiment of the power amplifier, the control signals P1, N1, P2, N2, and FW are digital signals.

In an embodiment of the power amplifier, the PWM controller is configured to provide control signals to the first power control stage, to the second power control stage, and to the mid-voltage control circuit to suppress $3^{rd}$ and $5^{th}$ harmonics.

A method for operating a power amplifier is also disclosed. The method involves driving a first output between VDD and VSS, driving a second output between VDD and VSS, holding the voltage of the first output at a mid-voltage that is between VDD and VSS during an interval between when the first output is driven between VDD and VSS, and holding the voltage of the second output at the mid-voltage during an interval between when the second output is driven between VDD and VSS.

In an embodiment of the method, holding the voltage of the first output at a mid-voltage that is between VDD and VSS during an interval between when the first output is driven between VDD and VSS comprises turning on a first switch of a mid-voltage control circuit that is connected to the first output, and holding the voltage of the second output at a mid-voltage that is between VDD and VSS during an interval between when the second output is driven between VDD and VSS comprises turning on a second switch of the mid-voltage control circuit that is connected to the first output.

In an embodiment of the method, the method further involves controlling the interval during which the first switch is turned on to control the interval during which the voltage of the first output is held at the mid-voltage, and controlling the interval during which the second switch is turned on to control the interval during which the voltage of the second output is held at the mid-voltage.

In an embodiment of the method, holding the voltage of the first output at the mid-voltage comprises connecting the first output to a voltage holding circuit via the first switch of the mid-voltage control circuit and holding the voltage of the second output at the mid-voltage comprises connecting the second output to the voltage holding circuit via the second switch of the mid-voltage control circuit.

In an embodiment of the method, the voltage holding circuit includes an operational amplifier with one input connected between two series connected resistors, which are connected between VDD and VSS.

In an embodiment of the method, the method further involves controlling the interval during which the voltage of the first output is held at the mid-voltage and controlling the interval during which the voltage of the second output is held at the mid-voltage.

Another embodiment of a power amplifier is disclosed. The power amplifier includes a pulse wave modulation (PWM) controller, a first power control stage configured to drive a first output between VDD and VSS in response to a control signal from the PWM controller, a second power control stage configured to drive a second output between VDD and VSS in response to a control signal from the PWM controller, and a mid-voltage control circuit, wherein the PWM controller is configured to provide control signals to the first power control stage, to the second power control stage, and to the mid-voltage control circuit to suppress harmonics.

In an embodiment of the power amplifier, the mid-voltage control circuit is configured to hold the voltage of the first output at a mid-voltage that is between VDD and VSS during an interval between when the first output is driven between VDD and VSS, and hold the voltage of the second output at the mid-voltage during an interval between when the first output is driven between VDD and VSS.

In an embodiment of the power amplifier, the mid-voltage control circuit includes a first switch connected to the first output to hold the voltage of the first output at a mid-voltage that is between VDD and VSS during an interval between when the first output is driven between VDD and VSS, and a second switch connected to the second output to hold the voltage of the second output at the mid-voltage during an interval between when the second output is driven between VDD and VSS.

In an embodiment of the power amplifier, the mid-voltage control circuit further includes a voltage holding circuit connected between the first and second switches of the mid-voltage control circuit, wherein the voltage holding circuit includes an operational amplifier with one input connected between two series connected resistors, which are connected between VDD and VSS.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

FIG. 5B is a graph of transmission power at different spurious frequencies for a conventional power amplifier with a standard EMC filter and for a power amplifier with a harmonic suppression circuit and an EMC filter with reduced filtering capabilities.

FIG. 6 is a bar graph of harmonic suppression for different configurations of a power amplifier.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
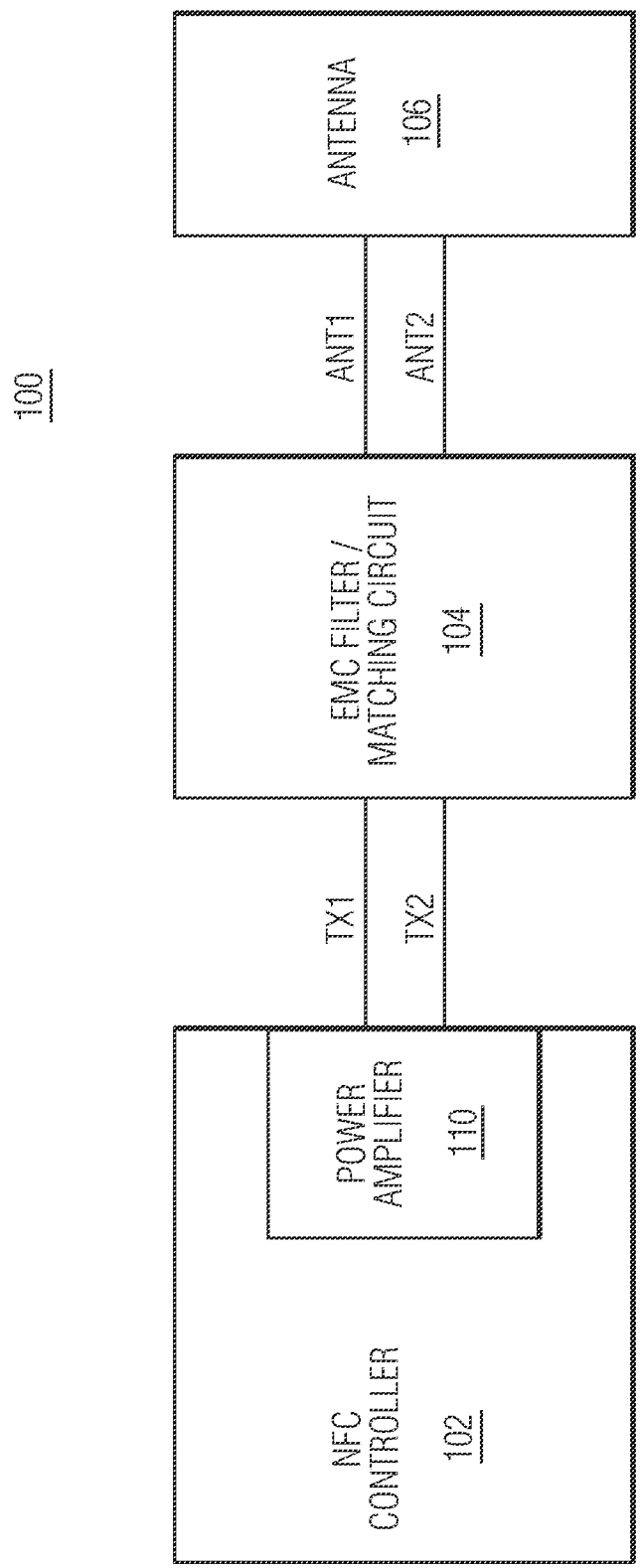
FIG. 1 is a schematic block diagram of a Near Field Communications (NFC) system.

FIG. 1 is a functional block diagram of a Near Field Communications (NFC) system 100 that includes an NFC controller 102, an EMC filter/matching circuit 104, and an antenna 106. NFC controller is typically an interface between the antenna and a host processor (not shown). In an embodiment, the NFC controller supports contactless communications according to the NFC communications standard as defined by the International Organization for Standardization (ISO) and the International Electrotechnical Commission (IEC) 14443 standard. In an embodiment, the NFC controller may execute a transaction involving communication with a reader (not shown), which may include exchanging messages using the antenna, for example, to read and/or write data from/to a secure memory. In an embodiment, the NFC controller includes a CPU, ROM, RAM, EEPROM, and I/O interfaces. An example of the NFC controller is the NFC controller, PN544 or PN547, by NXP SEMICONDUCTORS. The NFC controller also includes a power amplifier 110 that is used to generate output signals at transmit outputs, TX1 and TX2, which drive transmission of RF signals from the antenna. In an embodiment, the power amplifier is a push pull power amplifier that amplifies a modulated NFC signal to generate an NFC output signal with higher power to drive the antenna.

The EMC filter/matching circuit 104 of the NFC system 100, which is typically a separate IC device from the NFC controller 102 (and thus on a separate IC device from the power amplifier), is configured to filter an amplified signal from the NFC controller to provide an output signal to drive the antenna 106. The low frequency content of the amplified signal represents the desired output signal of the power amplifier. In an embodiment, the EMC filter portion of the EMC filter/matching circuit is implemented as a low-pass filter (LPF), which may be a low-loss second or higher order inductor-capacitor (LC) filter. The matching circuit portion of the EMC filter/matching circuit is configured to match the impedance of the antenna to the impedance of the RF circuits in the NFC controller. As is known in the field, a matching circuit may include inductors and capacitors.

The antenna 106 of the NFC system 100 can be an inductive antenna as known in the field of NFC communications. For example, the antenna may be spiral loop antenna that is optimized for inductive coupling. In the embodiment of FIG. 1, the antenna is connected to the EMC filter/matching circuit 104 by antenna connections, ANT1 and ANT2.

As described above, the outputs of a power amplifier in an NFC device typically include unwanted higher harmonics and an EMC filter is typically used to suppress the unwanted higher harmonics. The EMC filter can be a source of significant power losses and can significantly reduce the total system efficiency. Thus, in accordance with an embodiment of the invention, a power amplifier that exhibits improved harmonic suppression is provided. Such a power amplifier is configured to temporarily hold the voltages of the output signals at a mid-voltage (which is, for example, midway between VDD and VSS) as the output voltages transition between VDD and VSS. For example, an embodiment of such a power amplifier includes a pulse wave modulation (PWM) controller, a first power control stage configured to drive a first output between VDD and VSS in response to a control signal from the PWM controller, a second power control stage configured to drive a second output between VDD and VSS in response to a control signal from the PWM controller, and a mid-voltage control circuit configured to hold the voltage of the first output at a mid-voltage that is between VDD and VSS during an interval between when the first output is driven between VDD and VSS and to hold the voltage of the second output at the mid-voltage during an interval between when the first output is driven between VDD and VSS. Holding the output voltages at a midvoltage as the output voltages transition between VDD and VS can produce a more sinusoidal shaped output signal, which can help to reduce higher order harmonics. Reducing higher order harmonics can reduce the demands on a secondary filter such as an EMC filter. In an embodiment, the power amplifier is a push pull class D power amplifier.

Figure 2:
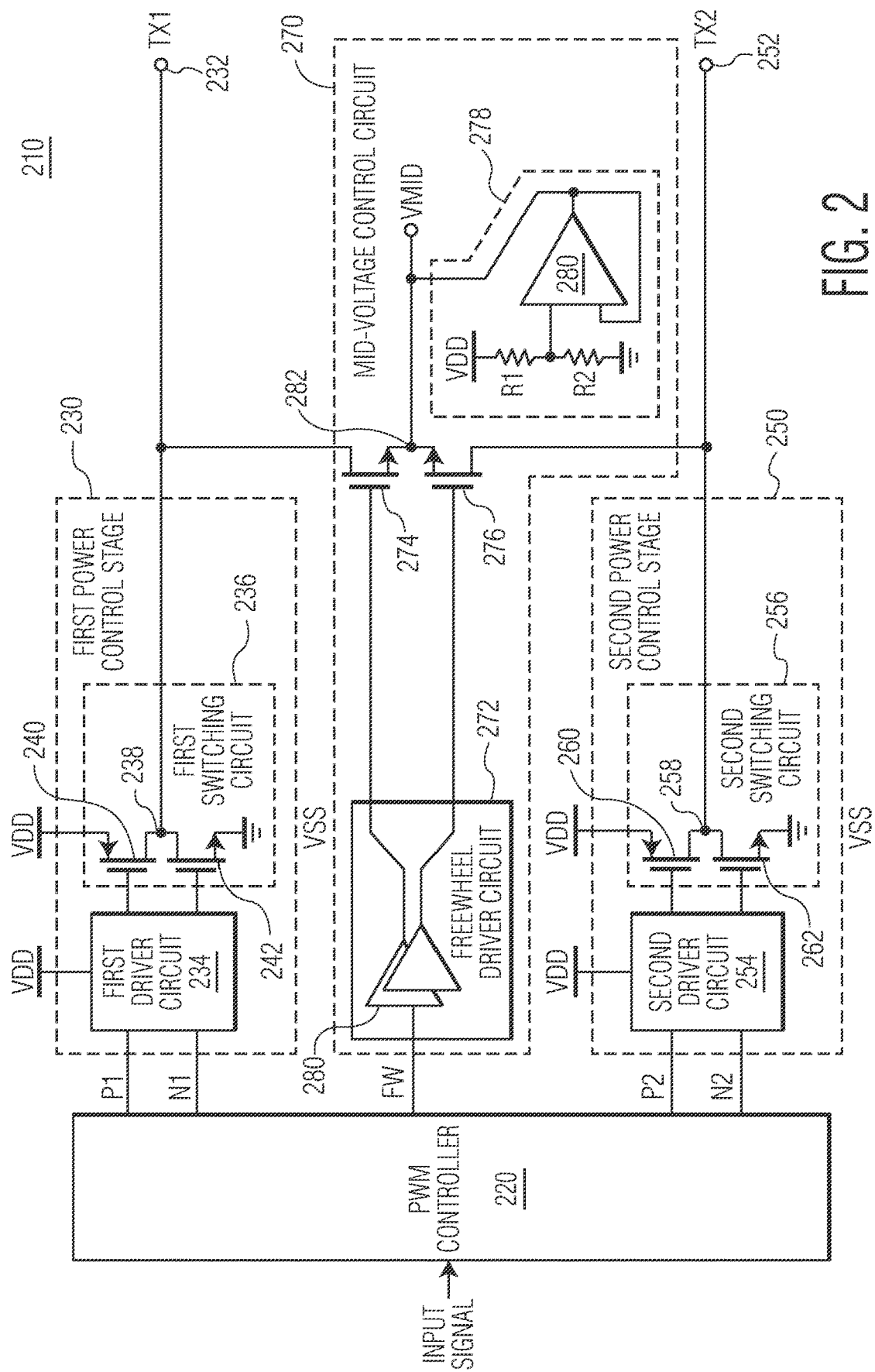
FIG. 2 depicts an embodiment of a push pull power amplifier.

FIG. 2 depicts an embodiment of a power amplifier 210, such as a push pull power amplifier. In the embodiment depicted in FIG. 2, the power amplifier includes a PWM controller 220, a first power control stage 230, a first transmit output (TX1) 232, a second power control stage 250, a second transmit output (TX2) 252, and a mid-voltage control circuit 270.

The first power control stage 230 of the power amplifier 210 includes a first driver circuit 234 and a first switching circuit 236, which provide a first output signal on the first transmit output 232, TX1.

The first switching circuit 236 includes a half-bridge 238 with a high-side switch 240 (e.g., a PMOS transistor) and a low-side switch 242 (e.g., an NMOS transistor). The high-side switch (e.g., a PMOS transistor) has an emitter connected to the power amplifier drain supply voltage, referred to herein as "VDD", a collector connected to the first transmit output, TX1, and a base connected to the first driver circuit (which is controlled in response to the input signal, P1). The low-side switch (e.g., an NMOS transistor) has a collector connected to the output, TX1 (and to the collector of the high-side switch), an emitter connected to the power amplifier source supply voltage (often times ground voltage), referred to herein as "VSS," and a base connected to the first driver circuit (which is controlled in response to the input signal, N1).

The first driver circuit 234 is configured to drive the base of the high-side and low-side switches, 240 and 242, respectively, of the first switching circuit 236. The first driver circuit may include amplifiers that are connected to amplify an input voltage, such as VDD, the voltage of the power amplifier. For example, the first driver circuit includes a first amplifier connected to generate a base control circuit in response to an input signal, P1, and a second amplifier connected to generate a base control circuit in response to an input signal, N1.

The second power control stage 250 of the power amplifier 210 includes a second driver circuit 254 and a second switching circuit 256, which provide a second output signal on the second transmit output 252, TX2.

The second switching circuit 256 includes a half-bridge 258 with a high-side switch 260 (e.g., a PMOS transistor) and a low-side switch 262 (e.g., an NMOS transistor). The high-side switch (e.g., a PMOS transistor) has an emitter connected to VDD, a collector connected to the second transmit output, TX2, and a base connected to the second driver circuit (which is controlled in response to the input signal, P2). The low-side switch (e.g., an NMOS transistor) has a collector connected to the second output, TX2 (and to the collector of the high-side switch), an emitter connected to the power amplifier source supply voltage (often times ground voltage), referred to herein as "VSS," and a base connected to the second driver circuit (which is controlled in response to the input signal, N2).

The second driver circuit 254 is configured to drive the base of the high-side and low-side switches, 260 and 262, respectively, of the second switching circuit 256. The second driver circuit may include amplifiers that are connected to amplify an input voltage, such as VDD. For example, the second driver circuit includes a second amplifier connected to generate a base control circuit in response to an input signal, P2, and a second amplifier connected to generate a base control circuit in response to an input signal, N2.

The mid-voltage control circuit 270 is configured to temporarily hold the output voltages of the first and second transmit outputs, TX1 and TX2, respectively, at a midvoltage (which is, for example, a voltage that is midway between VDD and VSS) as the output voltages transition between VDD and VSS. Temporarily holding the output voltages at a mid-voltage (which is, for example, midway between VDD and VSS) as the output voltages transition between VDD and VSS can help reduce higher order harmonics. Reducing higher order harmonics can reduce the demands on a secondary filter such as an EMC filter.

The mid-voltage control circuit 270 includes a freewheel driver circuit 272, mid-voltage control switches 274 and 276, and a voltage holding circuit 278. The mid-voltage control circuit is configured to hold the voltage at mid-voltage level during a mid-voltage interval that exists between the moment in time when the voltage is at VDD and the moment in time when the voltage is at VSS.

The freewheel driver circuit 272 is configured to drive the two mid-voltage control switches 274 and 276 in response to a freewheel control signal from the PWM controller 220 to turn on and off the two switches. In an embodiment, the freewheel control signal includes two parallel signals that control the two mid-voltage control switches in parallel. The freewheel driver circuit includes amplifiers 280 to drive the signals that turn on and off the mid-voltage control switches. In an embodiment, the freewheel control signals can be adjusted to adjust the interval over which the output signals are held at the mid-voltage. Adjusting the interval over which the output signals are held at the mid-voltage can influence the shape of the output signals, which can in turn influence harmonic suppression.

The voltage holding circuit 278 of the mid-voltage control circuit 270 includes an operational amplifier 280 with one input connected between two series connected resistors R1 and R2, which are connected between VDD and VSS. The output of the operational amplifier is connected to a half-bridge 282 between the two mid-voltage control switches 274 and 276. In an embodiment, the "mid-voltage" (or VMID) is a voltage that is halfway between VDD and VSS. In the embodiment of FIG. 2, the mid-voltage is determined by the ratio of the resistance of resistors R1 and R2.

The PWM controller 220 of the power amplifier 210 is configured to modulate an input signal to generate modulated output signals on the first and second outputs, TX1 and TX2, respectively. In some embodiments, the PWM controller is configured to generate digital control signals in response to a digital input signal. For example, the PWM controller generates digital control signals P1, N1, FW, P2, and N2 in response to a digital input signal. In the embodiment of FIG. 2, the control signal, P1, controls the high-side switch 240 (e.g., the PMOS transistor) of the first power control stage 230 and the control signal, N1, controls the low-side switch 242 (e.g., the NMOS transistor) of the first power control stage. The freewheel control signal, FW, which may actually be two separate signals, is used to control the switches 274 and 276 of the mid-voltage control circuit 270. The control signal, P2, controls the high-side switch 260 (e.g., the PMOS transistor) of the second power control stage 250 and the control signal, N2, controls the low-side switch 262 (e.g., the NMOS transistor) of the second power control stage.

Figure 3A:
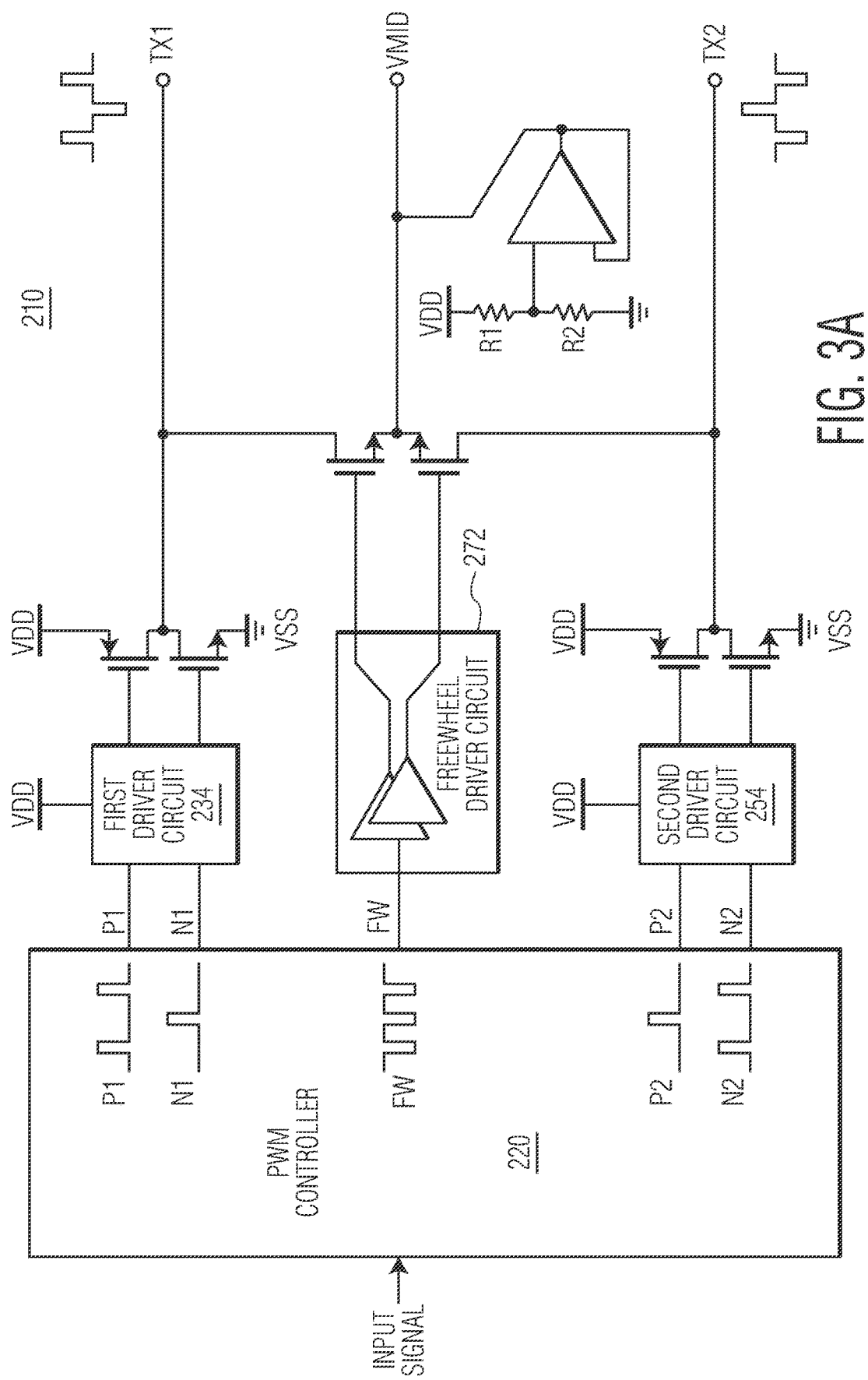
FIG. 3A depicts the push pull amplifier of FIG. 2 with corresponding signal timing diagrams.

FIG. 3A depicts the power amplifier 210 of FIG. 2 with corresponding signal timing diagrams. In particular, FIG. 3A includes a timing diagram of the control signal, P1 (which is used to control the high-side switch 240, e.g., the PMOS switch of the first switching circuit 236), a timing diagram of the control signal, N1 (which is used to control the low-side switch 242, e.g., the NMOS switch of the first switching circuit), a timing diagram of the control signal, P2 (which is used to control the high-side switch 260, e.g., the PMOS switch of the second switching circuit), a timing diagram of the control signal, N2 (which is used to control the low-side switch 262, e.g., the NMOS switch of the second switching circuit), a timing diagram of the freewheel control signal, FW (which is used to control the mid-voltage control switches 274 and 276 of the mid-voltage control circuit 270), a timing diagram of the output signal at output, TX1, and a timing diagram of the output signal at output, TX2.

Figure 3B:
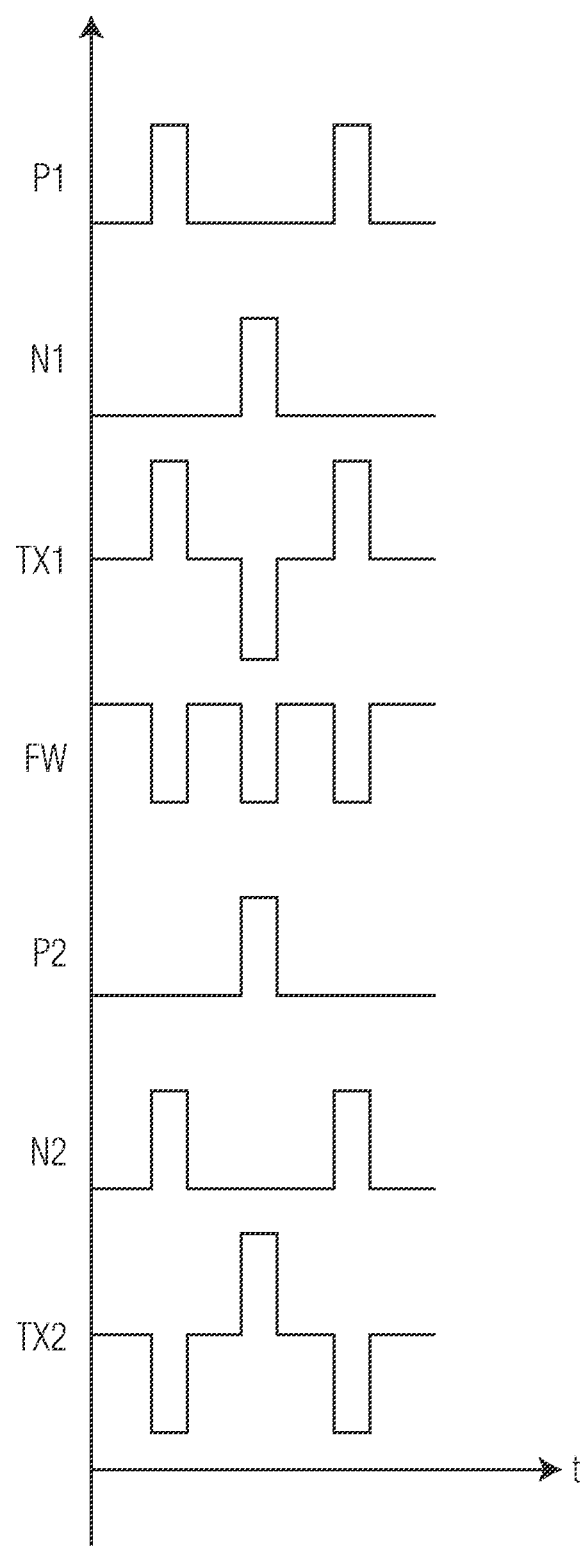
FIG. 3B is a signal timing diagram that illustrates the relative timing of the signals shown in FIG. 3A.

FIG. 3B is a signal timing diagram that illustrates the relative timing of the signals shown in FIG. 3A. In particular, the signal timing diagram of FIG. 3B illustrates the relative timing of the control signals, P1, N1, FW, P2, and N2 and the output signals at outputs TX1 and TX2.

Figure 4:
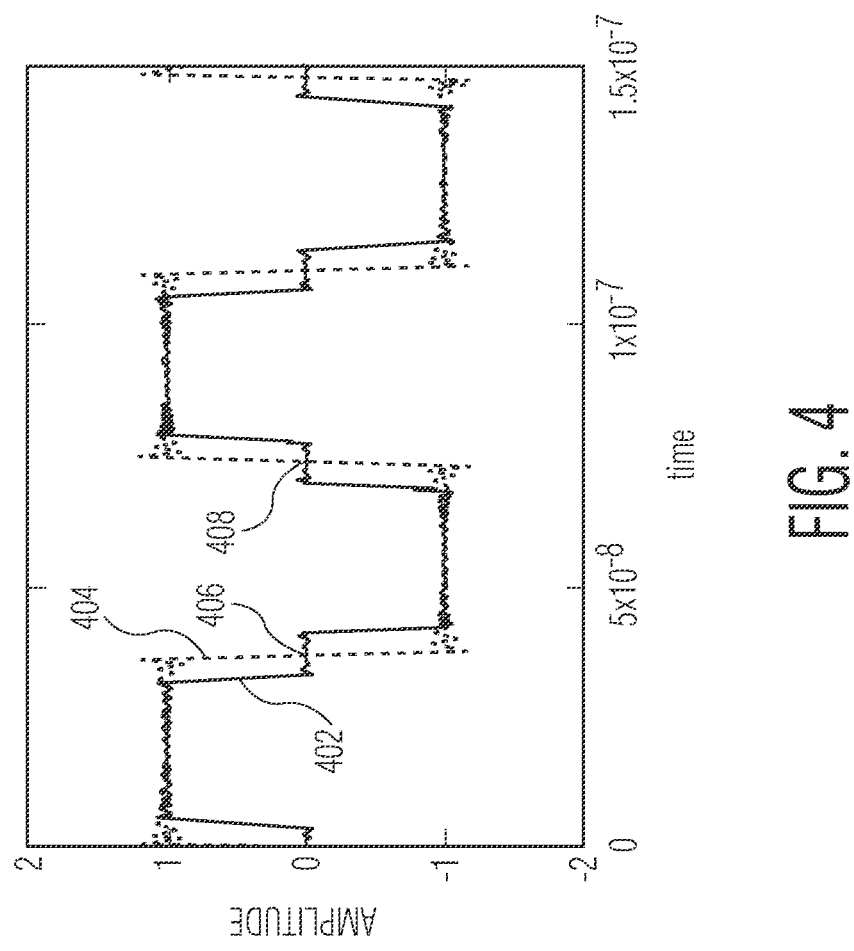
FIG. 4 depicts the shape of an output signal that is output from the push pull amplifier as described above with reference to FIGS. 2, 3A, and 3B.

FIG. 4 depicts the shape of an output signal 402 at one of the outputs, e.g., TX1 or TX2, that is output from the power amplifier as described above with reference to FIGS. 2, 3A, and 3B relative to the shape of a conventional signal 404, which has more of a rectangular shape. As illustrated in FIG. 3A, the output signal 402 has intervals 406 and 408 at which the signal is temporarily held at the mid-voltage level, e.g., a voltage approximately midway between the high voltage VDD and the low voltage VSS. In the example shown in FIG. 4, the time spent at the mid-voltage is approximately 15% of one cycle. The shape of the output signal 402 that is temporality held at the mid-voltage has more of a sinusoidal shape than the conventional signal and exhibits reduced higher order harmonics.

Figure 5A:
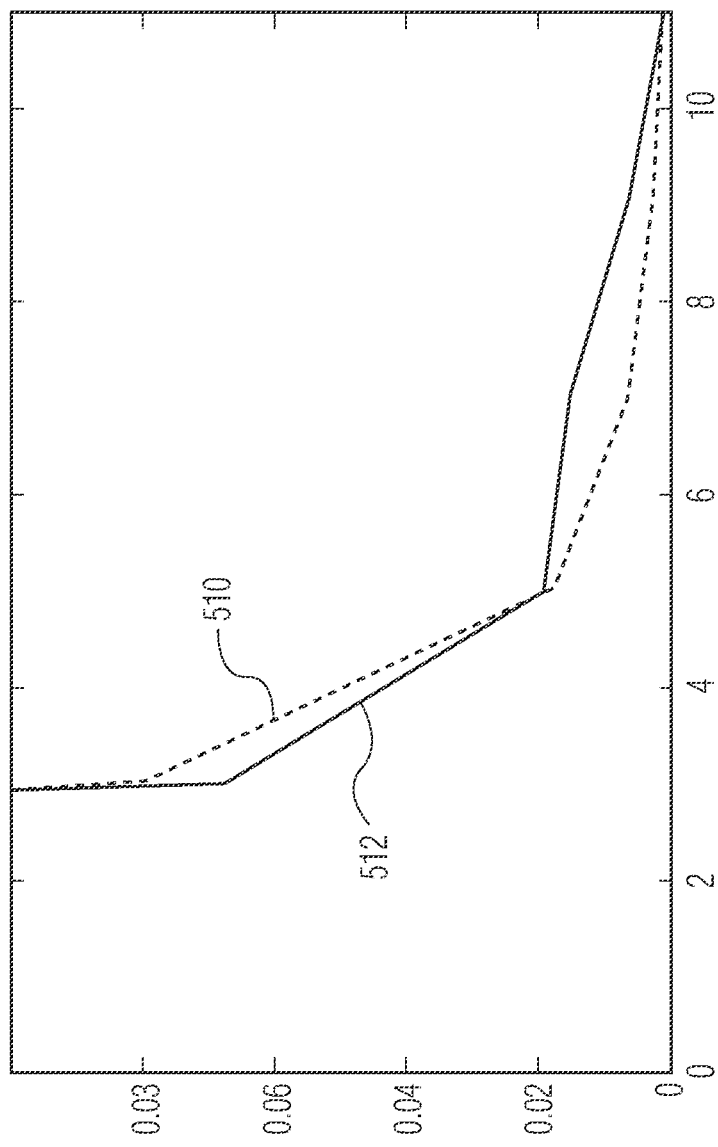
FIG. 5A is a graph of transmission current at different spurious frequencies for a conventional power amplifier with a standard EMC filter and for a power amplifier with a harmonic suppression circuit and an EMC filter with reduced filtering capabilities.

FIG. 5A is a graph of a transmission current signal 510 at different spurious frequencies for a conventional power amplifier combined with a standard EMC filter (e.g., inductance at 106 nanohenry (nH)) and a transmission current signal 512 for a power amplifier with a mid-voltage control circuit as described above combined with an EMC filter with reduced filtering capabilities (e.g., inductance at 56 nH). The graph of FIG. 5A is based on both systems having the same transmission current but EMC filters with different inductance.

FIG. 5B is a graph of a transmission power signal 514 at different spurious frequencies for a conventional power amplifier with a standard EMC filter and a transmission power signal 516 for a power amplifier with a harmonic suppression circuit and an EMC filter with reduced filtering capabilities.

FIG. 6 is a bar graph of harmonic suppression for different configurations of a power amplifier. In particular, FIG. 6 shows bar graphs for harmonics 1-9 (H1-H9) for six different power amplifier configurations. The power amplifier configurations are: configuration 1— PP-PA 50% duty; configuration 2— PP-PA 30/70% duty; configuration 3— PP-PA with freewheel at 7.5% VMID; configuration 4— PP-PA with freewheel at 11.25% VMID; configuration 5— PP-PA with freewheel at 15% VMID; and configuration 6— PP-PA with freewheel at 30% VMID.

As illustrated in FIG. 6, implementing mid-voltage control can effectively suppress third and fifth order harmonics (H3 and H5) to reduce the radiated power. Third and fifth order harmonics are known to have a relatively big impact on system performance.

Figure 7:
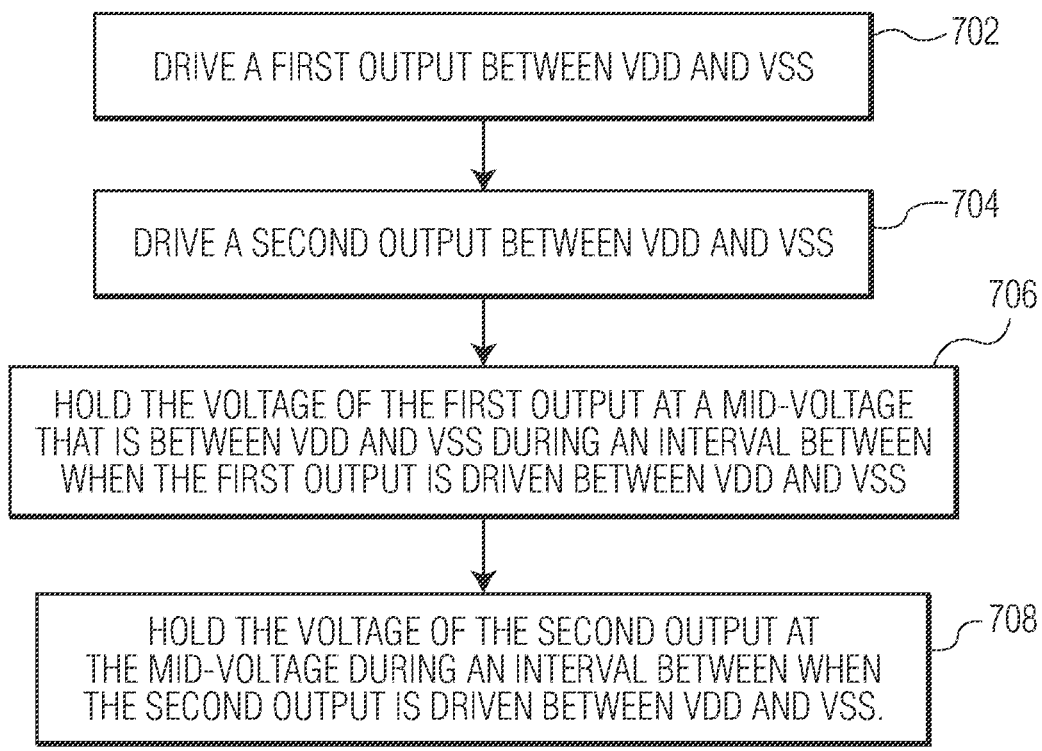
FIG. 7 is a process flow diagram of a method for operating a push pull power amplifier in accordance with an embodiment of the invention.

FIG. 7 is a process flow diagram of a method for operating a push pull power amplifier in accordance with an embodiment of the invention. At block 702, a first output is driven between VDD and VSS. At block 704, a second output is driven between VDD and VSS. At block 706, the voltage of the first output is held at a mid-voltage that is between VDD and VSS during an interval between when the first output is driven between VDD and VSS. At block 708, the voltage of the second output is held at the mid-voltage during an interval between when the second output is driven between VDD and VSS. Although the operations of the method(s) described herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

The techniques described herein allow for adaptive harmonic suppression through a novel power amplifier, such as a push pull class D power amplifier as described above. The techniques described herein enable high-power efficiency of the power amplifier to be maintained while intentionally suppressing certain unwanted harmonics, which allows for reducing (e.g., by half) the EMC filter requirements and improving the overall system efficiency. For example, the overall system efficiency is composed of the main power transmitted at the fundamental frequency of, for example, 13.56 MHz while avoiding unwanted power, e.g., power at the $3^{rd}$ harmonic. The techniques described herein can suppress certain harmonics to relax the power requirements of the external matching, e.g., by factor 2. The techniques described herein can suppress third order and fifth order harmonics to reduce the radiated power (most critical ones). In an embodiment, the techniques may be used to regulate the driver output power and/or to perform advanced signal shaping. For certain applications, the EMC filter can be removed (e.g., because there are no dominant $2^{nd}$, $3^{rd}$, $4^{th}$ or $5^{th}$ harmonics).

In an embodiment, the power amplifier is used for NFC communications according to NFC standards. For example, NFC standards cover communications protocols and data exchange formats, and are based on existing RFID standards including ISO/IEC 14443 and FeliCa. The standards include ISO/IEC 18092 and those defined by the NFC Forum. Although the power amplifier is described as being used in an NFC application, the power amplifier as described herein can be used in other applications where power amplification is used.

Although specific embodiments of the invention have been described and illustrated, the invention is not to be limited to the specific forms or arrangements of parts so described and illustrated. The scope of the invention is to be defined by the claims appended hereto and their equivalents.

The invention claimed is:

1. A power amplifier comprising:
a pulse wave modulation (PWM) controller;
a first power control stage configured to drive a first output between VDD and VSS in response to a control signal from the PWM controller;
a second power control stage configured to drive a second output between VDD and VSS in response to a control signal from the PWM controller; and a mid-voltage control circuit comprising:
a first switch connected to the first output to hold the voltage of the first output at a mid-voltage that is between VDD and VSS during an interval between when the first output is driven between VDD and VSS;
a second switch connected to the second output to hold the voltage of the second output at the mid-voltage during an interval between when the second output is driven between VDD and VSS; and
a voltage holding circuit connected between the first and second switches of the mid-voltage control circuit.

2. The power amplifier of claim 1, wherein the voltage holding circuit includes an operational amplifier with one input connected between two series connected resistors, which are connected between VDD and VSS.

3. The power amplifier of claim 1, wherein:
the first power control stage includes a high-side switch and a low-side switch in series and wherein the first output is connected between the high-side switch and the low-side switch;
the second power control stage includes a high-side switch and a low-side switch in series and wherein the second output is connected between the high-side switch and the low-side switch;
wherein the mid-voltage control circuit includes:
a first switch connected to the first output to hold the voltage of the first output at a mid-voltage that is between VDD and VSS during an interval between when the first output is driven between VDD and VSS; and
a second switch connected to the second output to hold the voltage of the second output at the mid-voltage during an interval between when the second output is driven between VDD and VSS.

4. The power amplifier of claim 3, wherein the mid-voltage control circuit further includes a voltage holding circuit connected between the first and second switches of the mid-voltage control circuit.

5. The power amplifier of claim 4 wherein the voltage holding circuit includes an operational amplifier with one input connected between two series connected resistors, which are connected between VDD and VSS.

6. The power amplifier of claim 1, wherein:
the first power control stage includes a high-side switch and a low-side switch in series and wherein the first output is connected between the high-side switch and the low-side switch;

the second power control stage includes a high-side switch and a low-side switch in series and wherein the second output is connected between the high-side switch and the low-side switch;

wherein the mid-voltage control circuit including:

a first switch connected to the first output to hold the voltage of the first output at a mid-voltage that is between VDD and VSS during an interval between when the first output is driven between VDD and VSS; and a second switch connected to the second output to hold the voltage of the second output at the mid-voltage during an interval between when the second output is driven between VDD and VSS;

wherein the PWM controller is configured to:

provide a high-side switch control signal, P1, to control the high-side switch of the first power control stage and a low-side switch control signal, N1, to control the low-side switch of the first power control stage;

provide a high-side switch control signal, P2, to control the high-side switch of the second power control stage and a low-side switch control signal, N2, to control the low-side switch of the first power control stage; and provide a freewheel control signal, FW, to control the first switch and the second switch of the mid-voltage control circuit.

7. The power amplifier of claim 6, wherein the control signals P1, N1, P2, N2, and FW are digital signals.

8. The power amplifier of claim 1, wherein the PWM controller is configured to provide control signals to the first power control stage, to the second power control stage, and to the mid-voltage control circuit to suppress $3^{rd}$ and $5^{th}$ harmonics.

9. A method for operating a power amplifier, the method comprising:

driving a first output between VDD and VSS;

driving a second output between VDD and VSS;

turning on a first switch of a mid-voltage control circuit to connect the first output to a voltage holding circuit to hold a voltage of the first output at a mid-voltage that is between VDD and VSS during an interval between when the first output is driven between VDD and VSS; and turning on a second switch of the mid-voltage control circuit to connect to the second output to a voltage holding circuit to hold a voltage of the second output at the mid-voltage during an interval between when the second output is driven between VDD and VSS.

10. The method of claim 9, further comprising:

controlling the interval during which the first switch is turned on to control the interval during which the voltage of the first output is held at the mid-voltage; and controlling the interval during which the second switch is turned on to control the interval during which the voltage of the second output is held at the mid-voltage.

11. The method of claim 9, further comprising controlling the interval during which the voltage of the first output is held at the mid-voltage and controlling the interval during which the voltage of the second output is held at the mid-voltage.

* * * * *